US006964003B2

(12) United States Patent
Thibeault

(10) Patent No.: US 6,964,003 B2
(45) Date of Patent: Nov. 8, 2005

(54) INTEGRATED CIRCUIT TESTING SYSTEM AND METHOD

(75) Inventor: Claude Thibeault, Brossard (CA)

(73) Assignee: Socovar, Societe en Commandite, Montreal ( * ) Notice: Subject to any disclaimer, the term of this patent is extended or adjusted under 35 U.S.C. 154(b) by 460 days.

(21) Appl. No.: 10/313,486

(22) Filed: Dec. 4, 2002

(65) Prior Publication Data

US 2003/0102883 A1 Jun. 5, 2003

(30) Foreign Application Priority Data

Dec. 5, 2001 (CA) .......................................... 2364421

(51) Int. Cl.[7] .......................................... G01R 31/28
(52) U.S. Cl. ...................... 714/731; 365/233; 327/161
(58) Field of Search ............................ 714/731, 814, 714/815; 365/233; 327/161

(56) References Cited

U.S. PATENT DOCUMENTS 4,495,628 A 1/1985 Zasio ........................ 377/70
5,159,598 A 10/1992 Welles, II et al. ......... 371/22.1
5,255,383 A * 10/1993 Lewis et al. ................ 713/600
5,473,618 A 12/1995 Takeshita et al. .......... 371/22.5
5,581,563 A 12/1996 Penza et al. .............. 371/22.1
5,802,270 A 9/1998 Ko et al. ............... 395/183.03
6,111,812 A * 8/2000 Gans et al. ................. 365/233
6,185,706 B1 2/2001 Sugasawara ................ 714/724
6,304,511 B1 * 10/2001 Gans et al. ................. 365/233

* cited by examiner

*Primary Examiner*—Phung My Chung
(74) *Attorney, Agent, or Firm*—Merchant & Gould P.C.

(57) ABSTRACT

A system and method for testing the data propagation time in an integrated circuit at relatively low speed is described herein. The method uses at least two parallel circuits comprising a data circuit and a clock circuit, wherein these parallel circuits are provided with at least one inverter for sensing the feeding current of each circuit so as to obtain current pulses that are transformed into binary signals forwarded to a tester that measures the delay time between these signals.

15 Claims, 3 Drawing Sheets

INTEGRATED CIRCUIT TESTING SYSTEM AND METHOD

FIELD OF THE INVENTION

The present invention relates to integrated circuits (ICs) testing. More specifically, the present invention is concerned with integrated circuits delay testing system and method.

BACKGROUND OF THE INVENTION

Conventionally, a number of integrated circuits are formed on a single wafer. The wafer is scribed along unused channels between integrated circuits so that each integrated circuit can be broken off, or otherwise separated, from the wafer. Finally, each integrated circuit is individually packed in an integrated circuit package.

Generally, the integrated circuits are tested before the wafers are broken and also following the packaging. Important tests that the integrated circuits typically have to pass following the packaging include delay tests, which are designed to verify that the circuits perform at the desired speed. Indeed, the ICs should operate at a clock frequency as determined in their specifications.

As a general trend, with the evolution of IC technology, the time delays of the integrated circuits decrease, which means that the propagation time of the pulses get smaller, resulting in a need for ever more precise, and most of all faster, measurements testers for performing time delay tests.

Several methods are commonly employed for testing the speed of integrated circuits. One such method consists in testing the functionalities of the circuits at the highest frequency they can tolerate. However, this approach involves the use of high-speed testers, which are expensive devices that must be frequently replaced as the IC technology evolves.

Built-in self-test methods are commonly developed for testing integrated circuits comprising embedded memory. Such methods provide testing facilities included by design into the circuits. However, since they result in larger surfaces of circuits and require additional sophisticated tools, such methods are not as often used with circuits comprising logic circuitry.

Integrated circuits comprising logic circuitry such as those using complementary metal oxide semiconductor (CMOS) logic circuitry are widely used in the fabrication of microprocessors, application specific integrated circuits ("ASICs") and memory storage areas.

Generally stated, the CMOS technology involves connecting p-channel MOS (for "metal oxide semiconductor") transistor networks and n-channel MOS transistor networks together into a MOS or IC device. The resulting devices, referred to as CMOS, are characterized by a decreased static dissipation of power, since they require very little current to operate in their steady state. Indeed, CMOS circuits only require power when their state is altered. CMOS are thus especially useful in the field of battery powered portable devices.

However, it is a shared concern in the art that the packaging step of ICs adds considerably to their manufacturing cost. Efforts have therefore been made in order to increase the level of testing ICs while they are still on the wafer, before even proceeding to the packaging step.

There is obviously room for improvement in the art, in relation to means for simply and cost effectively performing delay tests while the ICs are still on the wafer.

OBJECTS OF THE INVENTION

An object of the present invention is therefore to provide an improved integrated circuit testing system and method.

SUMMARY OF THE INVENTION

More specifically, according to an aspect of the present invention, there is provided a system for testing the propagation time of an integrated circuit; said testing system comprising:

a clock sensing circuit monitoring a clock signal of the integrated circuit; said clock sensing circuit generating a sensed clock signal;

a data sensing circuit monitoring a state transition at an input of a receiving latch of the integrated circuit; said data sensing circuit generating a sensed data signal;

wherein the propagation time of data through the integrated circuit is calculated by determining delays between said sensed clock signal and said sensed data signal.

According to another aspect of the present invention, there is provided a method for testing the propagation time of an integrated circuit; said method comprising the acts of:

generating a sensed clock signal corresponding to state transitions of a clock signal of the integrated circuit;

generating a sensed data signal corresponding to state transitions of the data present at an input of a receiving latch of the integrated circuit;

measuring the propagation time of data through the integrated circuit by calculated delays between the sensed clock signal and the sensed data signal.

Other objects, advantages and features of the present invention will become more apparent upon reading of the following non-restrictive description of preferred embodiments thereof, given by way of example only with reference to the accompanying drawings.

BRIEF DESCRIPTION OF THE DRAWINGS

In the appended drawings.

DESCRIPTION OF AN EMBODIMENT

In a nutshell, the general concept of the present invention is to provide a test capability, off-line, partly built-in or built-in, in an integrated circuit, which allows testing the circuit at low speed and assessing the delay and synchronization times of the circuit at an early stage of the testing process.

Figures 1, 2:
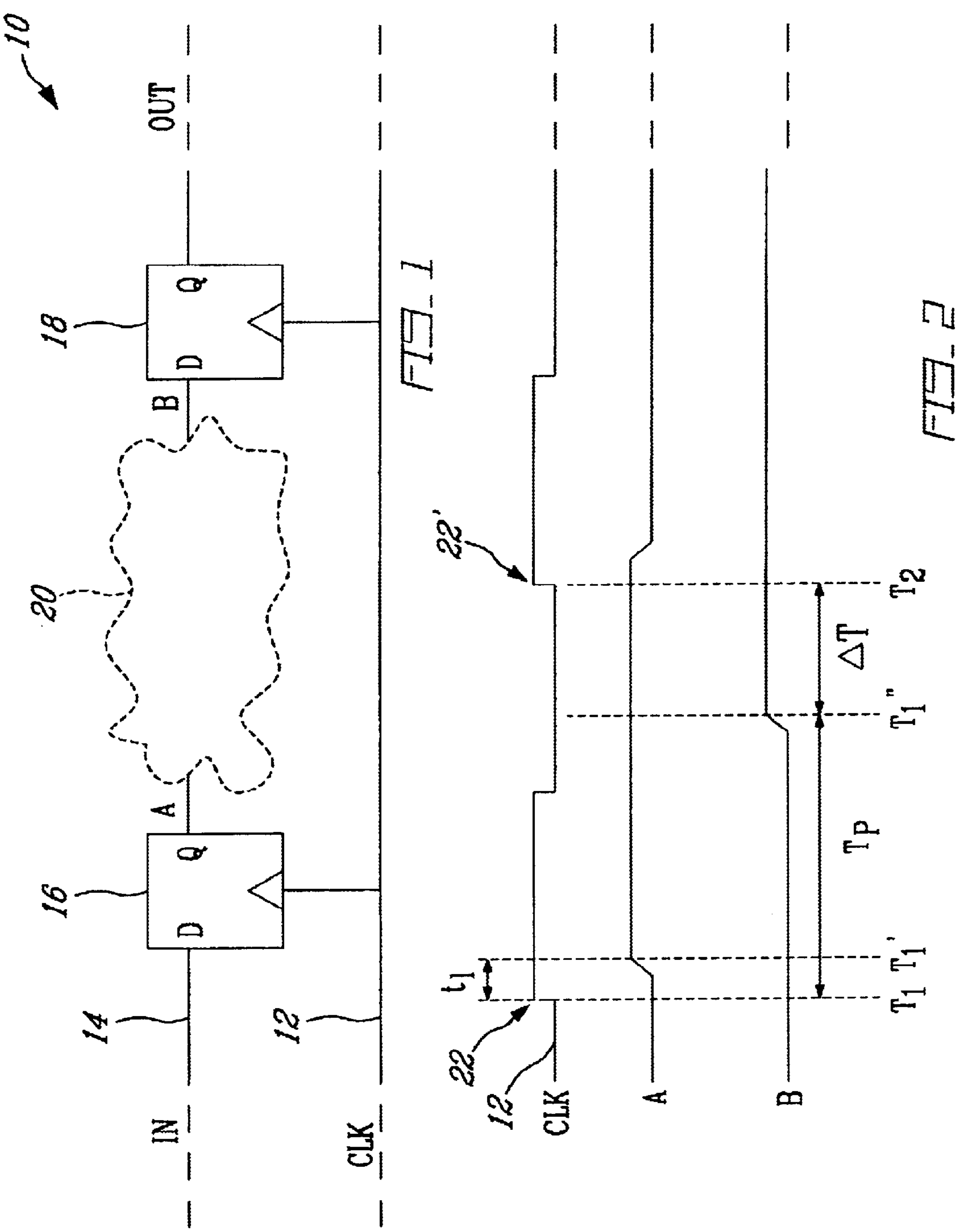
FIG. 1 schematically illustrates a conventional CMOS circuit.
FIG. 2 is a diagram of the propagation of a signal from point A to point B of the circuit of FIG. 1, given a clock signal, versus time.

As is known in the art and schematically illustrated in FIG. 1, an integrated circuit 10 based on combinatorial principle, such as a CMOS, usually includes at least one clock domain (labeled CLK), so that whenever a clock signal 12 goes through a transition, a data signal 14 is sent from the output Q of a transmitter latch 16 (point A) to the input D of a receiving latch 18 (point B) through combinatory logic 20.

As illustrated in FIG. 2, there is a delay "$t_i$" between the beginning time "$T_1$" of the clock signal transition 22 and the starting time "$T_1$" of the signal propagation from point A. Moreover, the signal takes a time to reach point B. Generally stated, the signal takes a time "$T_p$", hereinafter referred to as the propagation time, after the signal transition 22 to reach the point B.

Moreover, generally, in order for the signal to be received in a stable state at the input D of the receiving latch 18 of FIG. 1 and to avoid metastability of latches, it is required that the signal arrives at point B a certain time "$\Delta T$" before the starting time "$T_2$" of the next clock signal transition, referred to as 22' in FIG. 2. Therefore, the period of the clock, that is, for example as shown in FIG. 2, the time between two consecutive low-to-high transitions 22 and 22' (at times $T_1$ and $T_2$ respectively) of the clock signal 12, and the propagation time of the signal from the latch 16 to point B, contribute to determine the minimum time $\Delta T$ possible to achieve a stable signal state at the input D of the receiving latch 18 of FIG. 1.

As will be understood by one skilled in the art, the propagation time of the signal, i.e. the value of $T_p$, is independent of the clock speed. Therefore, the propagation time of the signal can be determined at any clock speed, and advantageously at a lower clock speed, allowing the use of low-speed testers. The goal is therefore to be able to detect with sufficient precision the state change of the clock and the state change at point B to enable the determination of $T_p$.

Thus, a general concept of the present invention is to provide parallel circuits that transform changes of state, at predetermined point, into instantaneous current pulses so as to create parallel current circuits that do not interfere with the normal behavior of the IC. By transforming these current pulses into voltage pulses and by feeding these voltage pulses to a conventional tester, it is possible to determine $T_p$ and therefore to test the delay of the circuit at lower clock speed than the clock speed rating of the circuit.

An aspect of the present invention involves the use of inverters as sensors of change of state, as will be described hereinbelow.

Figure 3:
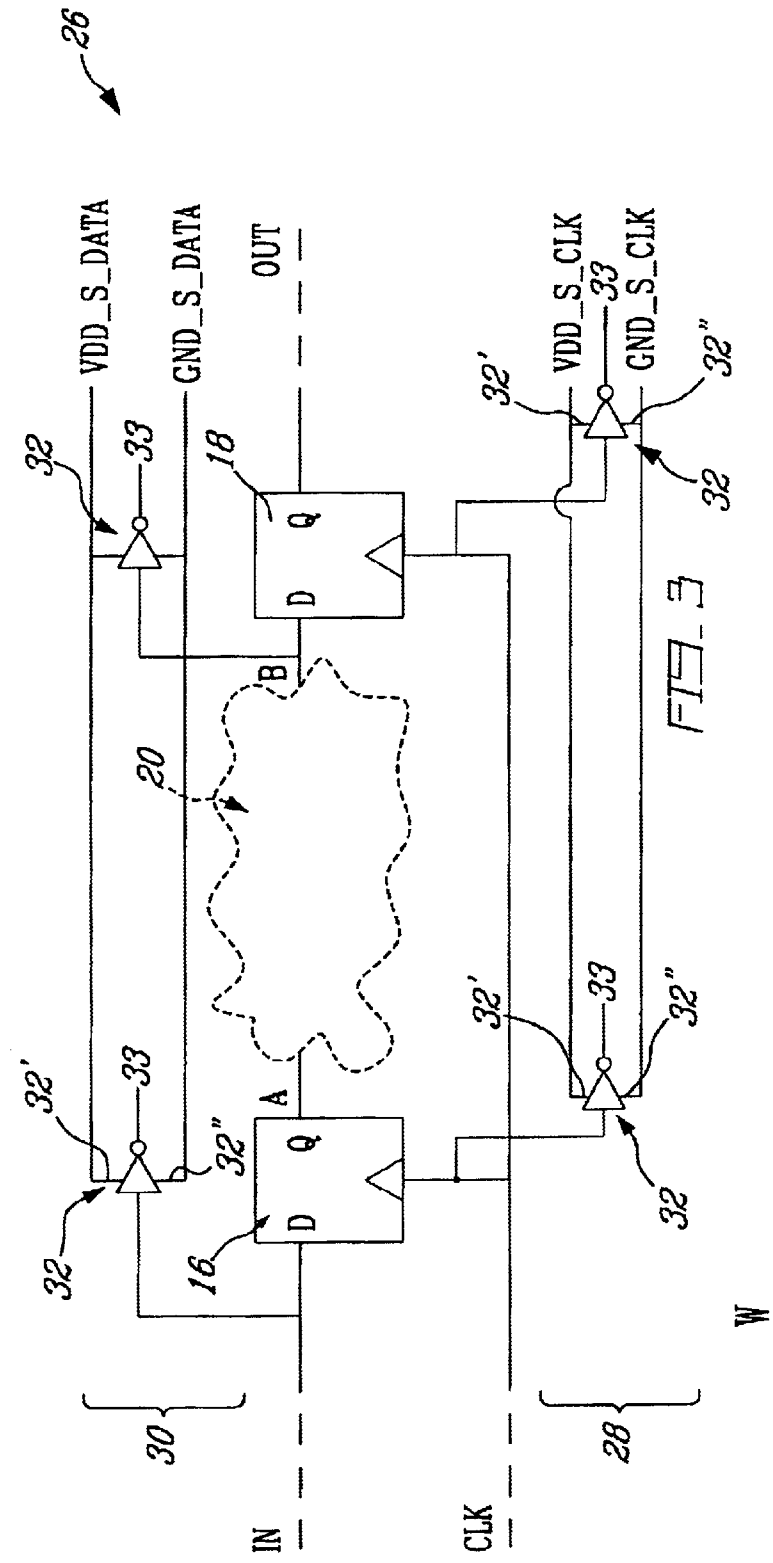
FIG. 3 schematically illustrates a CMOS circuit including a test circuit according to an embodiment of the present invention.
Figure 4:
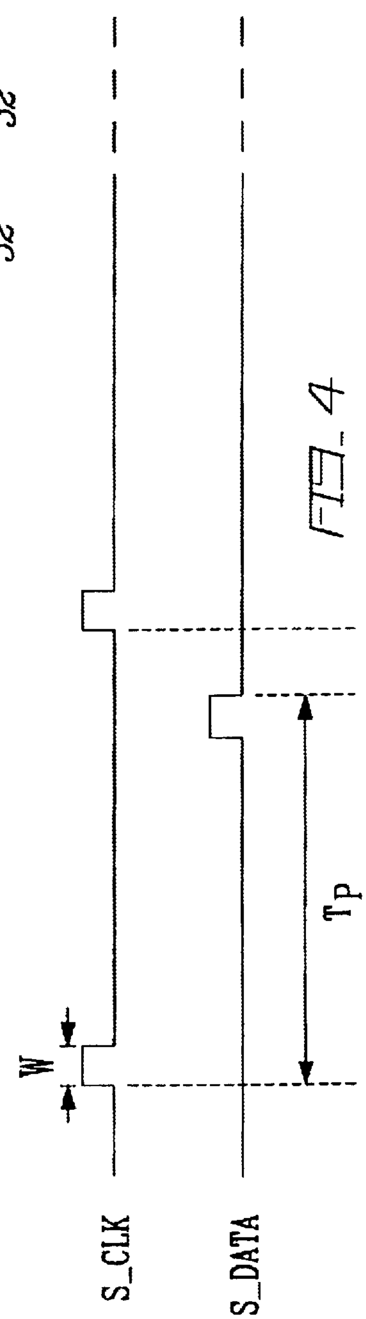
FIG. 4 is a diagram of the propagation of a signal in the CMOS circuit of FIG. 3, given a clock signal, versus time.
Figure 5:
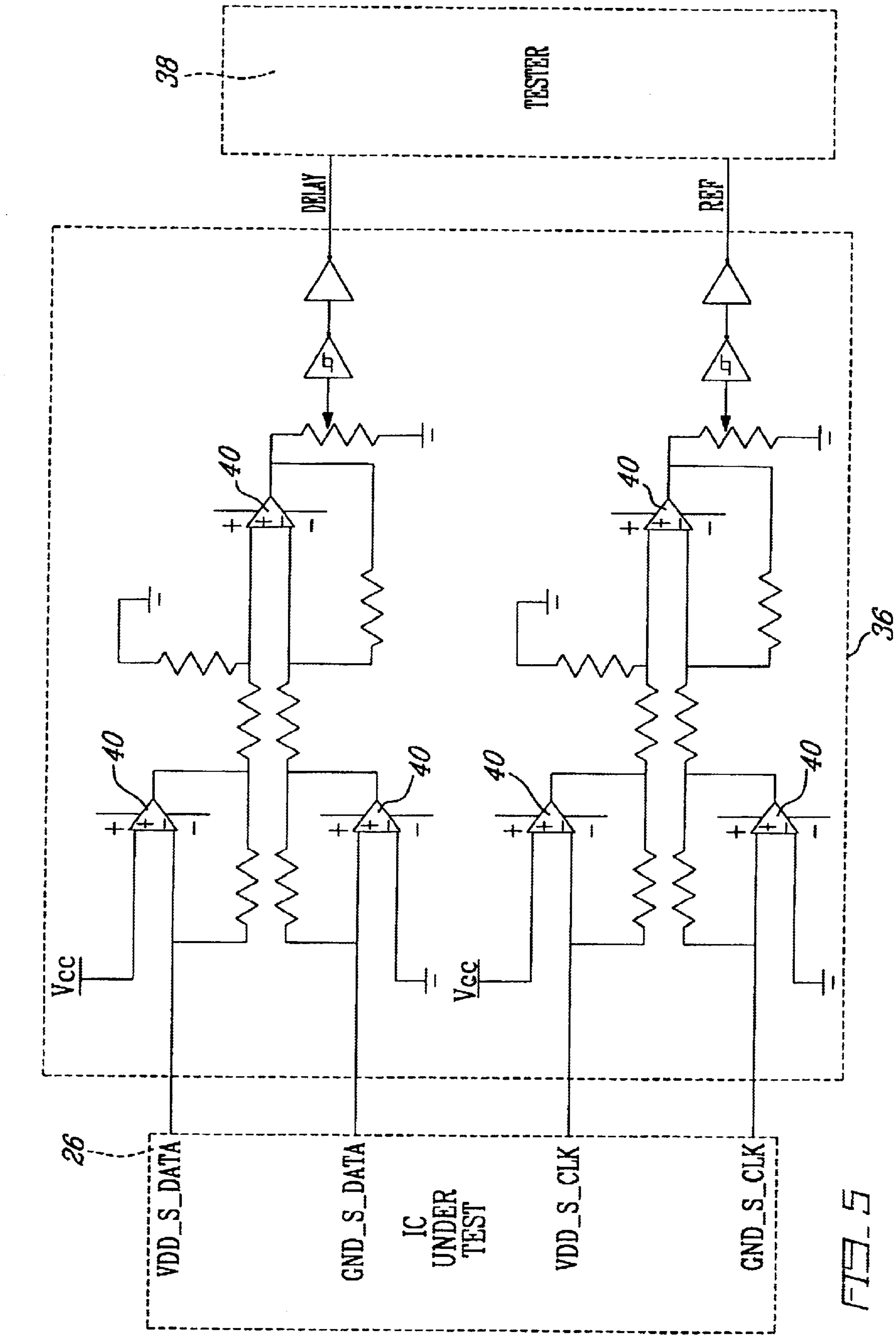
FIG. 5 is a diagram of an interface circuit, according to an aspect of the present invention.

Turning now to FIGS. 3 to 5 of the appended drawings, an embodiment of the method for ICs testing in accordance with the present invention will be described.

Generally illustrated in FIG. 3, the CMOS circuit 26 includes, in contrast to that of FIG. 1, a test circuit. The test system essentially consists in setting two parallel circuits: a clock sensor circuit 28 and a data sensor circuit 30, so as to allow the separate monitoring of the transition of two signals, namely the clock and the data at the input D of the receiving latch 18. The sensor circuits 28 and 30 generate two signals, namely the sensed clock signal ("S_CLOCK"), and the sensed data signal ("S_DATA").

Voltage-to-current converters 32 are inserted at the input of the data latch 16, and at the end of the distribution network of the clock signal. At least two circuits of converters are thus created, one (labeled 30) for monitoring the data signal, and the other one (labeled 28) for monitoring the clock signal.

In the circuits 28 and 30, a transition is transformed into a pulse of current by means of a voltage to current converters 32.

Inverters are used as voltage to current converters 32 in FIG. 3 to detect change of states. Therefore, only their "VDD" supply port 32' and their ground port "GND" 32" are considered, while their respective outputs 33 are disregarded. These inverters sense the current in the feed line of each one of the two parallel circuits 28 and 30, and provide current pulses corresponding to transitions. Indeed, one skilled in the art will understand that since the inverters use CMOS technology, they consume power only when a change of state occurs at their input. This power consumption generates detectable pulses of current.

FIG. 4 shows a simplified representation of the current signal of the clock ("S_CLK") and of the signal ("S_DATA") from the latches coming from the sensors. The propagation $T_p$ of the signal determines the delay of the circuit. Knowing the time $\Delta T$ required for the data to be stable at the next clock pulse, one may thus determine the fastest clock speed that may be used with the circuit 26.

Moreover, the width W of the current pulse corresponding to a transition of the clock is a measure of the synchronization bias, i.e. an evaluation of the time of propagation of the clock signal, due to the distribution network.

In case there is a need for wider current pulses W, it is possible to insert more than one inverter in series as a load to the first inverter so as to increase the duration of the current pulse.

Additionally, it is possible to minimize the current consumption when the circuit is in a normal operating mode, by using transmission gates (not shown) between the points to be tested and the first inverter 32. These gates being controllable to put the inverters 32 in the circuit only during the testing of the circuit.

As shown in FIG. 5, an interface 36 is provided between the circuit to be tested 26 and a tester 38. The interface 36 monitors the feed line of the inverters 32 and changes the current pulses from the inverters 32 into binary signals forwarded to the conventional tester 38.

As seen in FIG. 5, four signals, i.e. VDD_S_data, GND_S_DATA, VDD_S_CLK and GND_S_CLK are supplied to the interface 36. Two separate but similar amplification stages comprising operational amplifiers 40 are used to transform the current pulses into voltage pulses detectable by the tester 38.

Such interface 36 may be integrated to the circuit of the tester 38, or be external to the tester 38 as shown in FIG. 5.

It is also possible to integrate an interface 36 in the circuit to be tested 26 to enable a direct connection to the external tester 38 for measuring the delays between the pulses. In that case, part of the tester 38 that tests the delay can also be integrated into the circuit 26.

The tester 38 assesses the delay time between the binary signals (labeled DELAY) corresponding to the data and the binary signal (labeled REF) associated with the clock, i.e. the delay time between the beginning of a clock transition and the end of a data signal. This delay time precisely corresponds to the allowed delay time to be assessed.

By way of example of the present invention, an experiment is set up in order to measure different delay times with the system and method as disclosed herein. Inverters encountered in commercial IC are used as external sensors. An interface between the feed line of the inverters and the tester are used as described hereinabove. The delay times measured by way of this set up are comparable to the delay times obtained by means of a high-speed oscilloscope.

One skilled in the art will appreciate that such parallel circuits of current generally do not interfere with the ICs normal behavior. Usually, the inverters used in the test system described hereinabove only induce a negligible stray capacitance compared to other systems using multiplexers for instance.

It is to be noted that the inverters may be simple CMOS inverters, essentially made of two transistors.

An additional interesting feature is that the known ways of latch insertion, (such as the LSSD of IBM scan chain), may be applied in making the present sensor circuit. Indeed, the present invention makes use of scan latches.

Therefore, in an advantageous embodiment of the present invention, software devices are coupled to the system so as to enable automation of the insertion of the inverters in the neighborhood of the latches according to known methods such as the scan chain method, or LSSD by IBM. Although not essential to the invention, software tools are very useful. Existing software devices can be easily adapted to the present application, in particular software initially designed for the purpose of inserting of scanning latches.

As it will be apparent to one skilled in the art, the present invention enables sorting out integrated circuits that do not meet the fabrication specifications, at a very early stage in the testing process. Indeed, this selection takes place during the very first set of tests performed on the ICs, while they are still on the wafers, before they are even cut out and individually packaged. Thus, the present invention enables discarding defective circuits before they are packaged, which results in great cost and time savings.

A further advantage of the present invention is that it allows the use of existing testers, which need not be high-speed testers, for measuring delay times of the order of a few hundreds of picoseconds, instead of using high frequency (GHz) costly testers, as is required in conventional testing methods. For instance, a tester such as the IMS-XL60™ from Integrated Measurement System™ Inc., is characterized by a maximal frequency of 60 MHz, can be used for measuring relative delays with a 100 ps resolution. Indeed, as described hereinabove, the propagation delay $T_p$ is independent of the clock speed.

It is therefore obvious that the present invention permits an extended lifetime of semiconductor testers, thus reducing considerably the costs related to tests.

By permitting an early sorting out of defective ICs and the use of non-costly testers, and since it altogether provides means for extending the wear life of testers, the present invention contributes to important savings related to the tests of ICs.

It is found in practice that the present invention is straightforwardly applicable to testing integrated circuits of the CMOS type. It may be integrated to the software used during the design process and can be performed with standard testers.

In keeping with one of the principal objects of the invention, the method disclosed hereinabove is well adapted to detect defects causing delays in an integrated circuit without performing high-speed tests by means of expensive devices.

Although the present invention has been described hereinabove by way of preferred embodiments thereof, it can be modified, without departing from the spirit and nature of the subject invention as defined in the appended claims.

What is claimed is:

1. A system for testing the propagation time of an integrated circuit; said testing system comprising:

a clock sensing circuit monitoring a clock signal of the integrated circuit; said clock sensing circuit generating a sensed clock signal;

a data sensing circuit monitoring a state transition at an input of a receiving latch of the integrated circuit; said data sensing circuit generating a sensed data signal;

wherein the propagation time of data through the integrated circuit is calculated by determining delays between said sensed clock signal and said sensed data signal.

2. The testing system recited in claim 1, wherein said clock sensing circuit includes an inverter for sensing a transition in the clock signal of the integrated circuit and for generating a current pulse corresponding to the clock signal transition.

3. The testing system recited in claim 2, wherein said data sensing circuit includes an inverter for sensing a transition in the data signal at the input of the receiving latch of the integrated circuit and for generating a current pulse corresponding to the data signal transition.

4. The testing system recited in claim 3, further comprising an interface receiving the current pulses corresponding to the sensed clock and data signals and transforming these current pulses into binary signals.

5. The testing system recited in claim 4, wherein said interface is provided with an output configured to be read by a conventional circuit tester.

6. A method for testing the propagation time of an integrated circuit; said method comprising the acts of:

generating a sensed clock signal corresponding to state transitions of a clock signal of the integrated circuit;

generating a sensed data signal corresponding to state transitions of the data present at an input of a receiving latch of the integrated circuit;

measuring the propagation time of data through the integrated circuit by calculated delays between the sensed clock signal and the sensed data signal.

7. The testing method of claim 6, wherein said sensed clock signal generating act includes the sub-act of monitoring the state transitions of the clock signal.

8. The testing method of claim 7, wherein said clock signal monitoring sub-act includes sensing a transition in the clock signal of the integrated circuit and wherein said sensed clock signal generating act includes the sub-act of generating current pulses corresponding to clock signal transitions.

9. The testing method of claim 8, wherein said transition sensing sub-act includes providing an inverter for sensing said transitions.

10. The testing method of claim 8, wherein said sensed data signal generating act includes the sub-act of monitoring the state transitions of the data present at the input of the receiving latch of the integrated circuit.

11. The testing method of claim 10, wherein said state transition monitoring sub-act includes sensing a transition in the data present at the input of the receiving latch of the integrated circuit and wherein said sensed data signal generating act includes the sub-act of generating current pulses corresponding to transitions in the data present at the input of the receiving latch.

12. The testing method of claim 11, wherein said data transition sensing sub-act includes providing an inverter for sensing said transitions.

13. The testing method recited in claim 11, wherein said measuring act includes receiving the current pulses corresponding to the sensed clock and data signals.

14. The testing method recited in claim 13, wherein said measuring act includes transforming the current pulses into binary signals.

15. The testing method recited in claim 14, wherein said measuring act includes supplying the binary signals to a conventional circuit tester.

* * * * *